United States Patent
Kreutzwiesner et al.

(10) Patent No.: US 10,109,554 B2
(45) Date of Patent: Oct. 23, 2018

(54) MECHANICALLY STABLE, THERMALLY CONDUCTIVE AND ELECTRICALLY INSULATING STACK FORMING A MOUNTING DEVICE FOR ELECTRONIC COMPONENTS

(71) Applicant: AT & S Austria Technologie & Systemtechnik Aktiengesellschaft, Leoben (AT)

(72) Inventors: Elisabeth Kreutzwiesner, Graz (AT); Gernot Schulz, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/501,840

(22) PCT Filed: Aug. 4, 2015

(86) PCT No.: PCT/EP2015/067977
§ 371 (c)(1),
(2) Date: Feb. 4, 2017

(87) PCT Pub. No.: WO2016/020395
PCT Pub. Date: Feb. 11, 2016

(65) Prior Publication Data
US 2017/0229370 A1 Aug. 10, 2017

(30) Foreign Application Priority Data

Aug. 5, 2014 (DE) .................... 10 2014 111 142

(51) Int. Cl.
*H01L 23/373* (2006.01)
*H01L 23/538* (2006.01)
(Continued)

(52) U.S. Cl.
CPC ........ *H01L 23/3735* (2013.01); *H01L 21/481* (2013.01); *H01L 21/4807* (2013.01);
(Continued)

(58) Field of Classification Search
None
See application file for complete search history.

(56) References Cited

U.S. PATENT DOCUMENTS 4,574,879 A * 3/1986 DeGree .................. B32B 27/34
165/185
2004/0078969 A1 4/2004 Kanzawa et al.
(Continued)

FOREIGN PATENT DOCUMENTS

DE 100 35 170 B4 11/2005
EP 2 597 691 A1 5/2013
(Continued)

*Primary Examiner* — Bilkis Jahan
(74) *Attorney, Agent, or Firm* — Robert A. Blaha; Smith Tempel Blaha LLC

(57) ABSTRACT

A mounting device for mounting electronic components, wherein the mounting device comprises a stack, in particular a layer stack configured as alternating sequence of at least one support structure for providing mechanical support and a plurality of thermally conductive and electrically insulating structures.

20 Claims, 3 Drawing Sheets

(51) Int. Cl.
  *H01L 21/48* (2006.01)
  *H01L 23/498* (2006.01)
  *H01L 33/64* (2010.01)

(52) U.S. Cl.
  CPC ...... *H01L 23/3731* (2013.01); *H01L 23/3732* (2013.01); *H01L 23/49822* (2013.01); *H01L 23/49827* (2013.01); *H01L 23/49894* (2013.01); *H01L 23/5389* (2013.01); *H01L 33/641* (2013.01); *H01L 2924/0002* (2013.01)

(56) References Cited

U.S. PATENT DOCUMENTS

| | | | |
|---|---|---|---|
| 2005/0247945 A1 | 11/2005 | Chang et al. | |
| 2009/0069611 A1* | 3/2009 | Lukehart | B82Y 30/00 585/250 |
| 2009/0266599 A1 | 10/2009 | Kan et al. | |
| 2010/0025898 A1* | 2/2010 | Pope | A61L 27/06 264/669 |
| 2011/0133236 A1* | 6/2011 | Nozaki | H01L 33/642 257/98 |
| 2011/0149521 A1* | 6/2011 | Leu | C22C 1/02 361/719 |
| 2012/0112347 A1* | 5/2012 | Eckhardt | H01L 21/6835 257/751 |

FOREIGN PATENT DOCUMENTS

| | | |
|---|---|---|
| JP | 2008-195766 A | 8/2008 |
| WO | WO 2006/002013 A1 | 1/2006 |
| WO | WO 2012/176363 A1 | 12/2012 |

\* cited by examiner

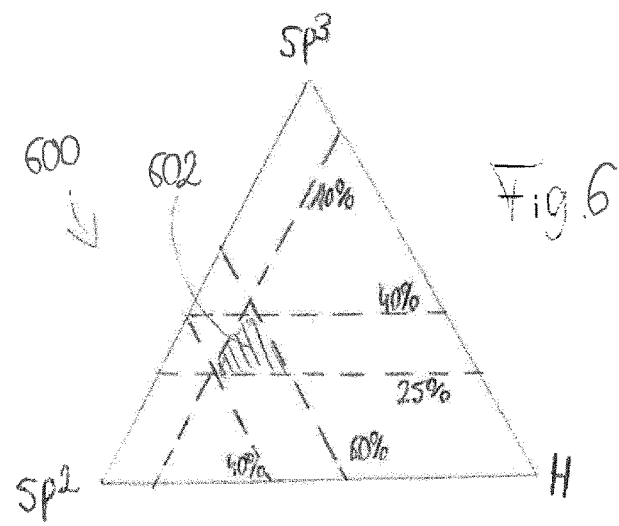
Fig. 6
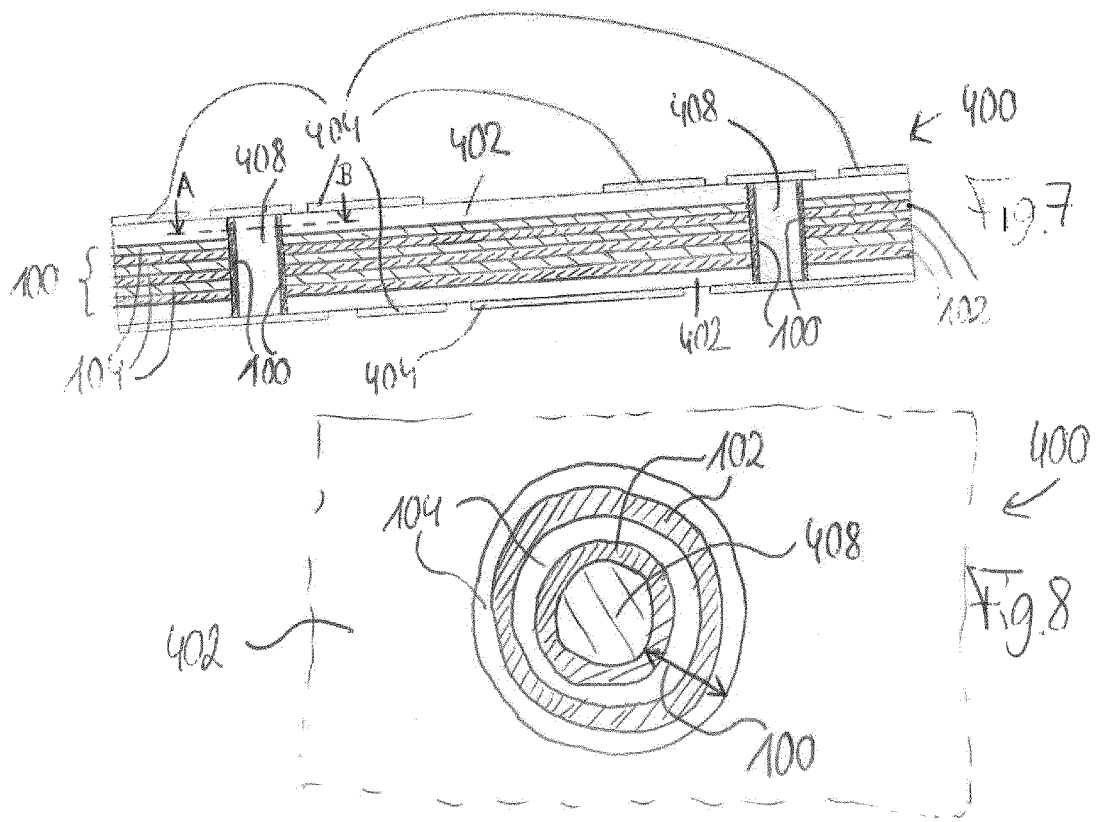
Fig. 7
Fig. 8 ized miniaturization of such electronic components as well as a rising number of electronic components to be mounted on mounting devices such as printed circuit boards, increasingly more powerful array-like components or packages having several electronic components are being employed, which have a plurality of contacts or connections, with ever smaller spacing between these contacts. Removal of heat generated by such electronic components and the mounting device itself during operation becomes an increasing issue. At the same time, mounting devices shall be mechanically robust so as to be operable even under harsh conditions.

MECHANICALLY STABLE, THERMALLY CONDUCTIVE AND ELECTRICALLY INSULATING STACK FORMING A MOUNTING DEVICE FOR ELECTRONIC COMPONENTS

CROSS-REFERENCE TO RELATED APPLICATIONS

This application claims the benefit of the filing date of German Patent Application No. 10 2014 111 142.7 filed 5 Aug. 2014, the disclosure of which is hereby incorporated herein by reference.

TECHNICAL FIELD

Embodiments of the invention relate to a mounting device, and a method of manufacturing a mounting device.

TECHNOLOGICAL BACKGROUND

In the context of growing product functionalities of mounting devices equipped with one or more electronic components and increasing miniaturization of such electronic components as well as a rising number of electronic components to be mounted on mounting devices such as printed circuit boards, increasingly more powerful array-like components or packages having several electronic components are being employed, which have a plurality of contacts or connections, with ever smaller spacing between these contacts. Removal of heat generated by such electronic components and the mounting device itself during operation becomes an increasing issue. At the same time, mounting devices shall be mechanically robust so as to be operable even under harsh conditions.

US 2009/0 266 599 A1 discloses a circuit board with a high thermal conductivity. The circuit board comprises a substrate and two thermally conductive electrically insulating layers which are respectively arranged on an upper surface and a lower surface of the substrate. The circuit board further comprises a patterned electrically conductive layer deposited on the surface of the thermally conductive electrically insulating layers.

DE 100 35 170 B4 discloses a ceramic body for heat dissipation from a semiconductor element. FIG. 2 shows the ceramic body 1 which comprises a multi-layer structure made of glass ceramic layers 15, 16, 27 and further comprises a plate 23 which is electrically insulating and thermally conductive. The plate 23 can be made of aluminum oxide or aluminum nitride. Further, the plate 23 is embedded in the multi-layer structure and thermally connected to the semiconductor element 18 by thermally conductive throughholes 4, 12.

US 2004/0 078 969 A1 discloses a method of manufacturing a circuit board. The printed circuit board comprises an electrically insulating layer, e.g. resin with a filler made of e.g. aluminum nitride. The circuit board further comprises a semiconductor element which is adhered to a circuit pattern of the circuit board by an electrically conductive adhesive. The semiconductor element is embedded within the electrically insulating layer. The filler contained in the electrically insulating layer increases the heat dissipation from the semiconductor element.

SUMMARY

There may be a need to provide an architecture for mounting devices which allows to provide a proper heat dissipation while ensuring high mechanical stability.

In order to achieve this need, a mounting device, and a method of manufacturing a mounting device according to the independent claims are provided.

According to an exemplary embodiment of the invention, a mounting device for mounting electronic components is provided, wherein the mounting device comprises a stack, in particular a layer stack, configured as alternating sequence of at least one support structure for providing mechanical support and a plurality of thermally conductive and electrically insulating structures (in particular at least part of the thermally conductive and electrically insulating structures being arranged directly on a respective one of the at least one support structure).

According to another exemplary embodiment of the invention, a method of manufacturing a mounting device for mounting electronic components is provided, wherein the method comprises forming a stack, in particular a layer stack, as alternating sequence of at least one support structure for providing mechanical support and a plurality of thermally conductive and electrically insulating structures.

In the context of the present application, a "stack" may denote an arrangement of multiple structures each of which being located on (in particular on top of) another one of the structures.

In the context of the present application, a "layer" may denote a planar film or sheet or foil (see for instance FIG. 1 to FIG. 3, FIG. 5) or a three-dimensionally bent film or sheet or foil or even a closed, for example tubular, jacket (see for instance FIG. 8). A layer may have a thickness which is significantly smaller than its extension in other directions. For instance, the extension in length and width direction of a planar layer may be at least five times, in particular at least ten times, of the thickness of the planar layer. A layer may be continuous or patterned.

In the context of the present application, a "mounting device" may denote a (particularly plate shaped) body which has an electrically insulating portion and one or more electrically conductive structures on at least one surface of the mounting device. Such a mounting device may serve as a basis for mounting one or more electronic components (such as packaged electronic chips, active and/or passive electronic members, sockets, etc.) thereon and/or therein and serves both as a mechanical support platform and an electrically wiring arrangement.

According to an exemplary embodiment, a mounting device is provided which is configured as an alternating sequence of stacked mechanically robust support structures and heat removing thermally conductive and electrically insulating structures. Thermally conductive and electrically insulating structures (such as diamond like carbon, DLC) have the great advantage to significantly contribute to the removal of heat generated during operation of the mounting device, but may tend to become mechanically unstable when their thickness becomes too large. On the other hand, mechanically stable support structures may provide strong mechanical stability to the mounting device, but, in some cases, are incapable of removing the large amount of heat generated in modern electronic applications. According to an exemplary embodiment of the invention, stacking an alternating sequence of these two constituents achieves both goals of a large heat removing, spreading and distributing capacity and a high mechanical stability at the same time. Moreover, the one or more support structures may additionally serve as adhesion promoter configured for promoting adhesion of material of the thermally conductive and electrically insulating structures within the mounting device, more precisely on a respective support structure. In particular, some highly appropriate materials for the thermally conductive and electrically insulating structure (such as diamond like carbon, DLC) may tend to become mechanically unstable at excessive thicknesses and may tend to lack adhesion on certain materials (such as copper in the case of DLC). The one or more support structures may hence simultaneously serve for both, providing intrinsic stability to the mounting device as a whole and promoting adhesion of directly adjacent thermally conductive and electrically insulating structures.

In the following, further exemplary embodiments of the mounting device and the method will be explained.

In an embodiment, each of the at least one support structure is in direct contact with at least one (in particular with one or two) of the thermally conductive and electrically insulating structures. Hence, the layer sequence may exclusively consist of the at least one support structure and the plurality of thermally conductive and electrically insulating structures, without intermediate structures in between. This may keep the mounting device compact and the manufacturing process simple without compromising in terms of heat removal capacity and mechanical stability.

In an embodiment, the stack (in particular layer stack) comprises an alternating sequence of a plurality of support structures (in particular layers) for providing mechanical support and the plurality of thermally conductive and electrically insulating structures (in particular layers). The number of alternating support structures and thermally conductive and electrically insulating structures may be freely selected by a user to obtain a mounting device with a desired thickness, stability, and heat removal capability. For instance, two, three, four, five or more support structures may be provided. Accordingly, two, three, four, five or more thermally conductive and electrically insulating structures may be provided. At least a part of the thermally conductive and electrically insulating structures may be covered on both of its opposing main surfaces with a respective one of the support structures. For instance, the layer stack may comprise a sandwich of at least three planar support layers and at least three planar thermally conductive and electrically insulating layers, arranged alternatingly. At least a part of the support structures may be covered on both of its opposing main surfaces with a respective one of the thermally conductive and electrically insulating structures. Different ones or all of the plurality of support structures may be made of the same material. Different ones or all of the plurality of thermally conductive and electrically insulating structures may be made of the same material. The support structure(s) on the one hand and the thermally conductive and electrically insulating structures on the other hand may be made of different materials.

In an embodiment, at least one of the group consisting of the support structure and the thermally conductive and electrically insulating structures is formed as a layer. Each of the layers may have a uniform or constant thickness. Different support layers may have the same thickness. Different thermally conductive and electrically insulating layers may have the same thickness. In a preferred embodiment, each of the support structure(s) and each of the thermally conductive and electrically insulating structures is shaped as a planar layer. In the mounting device, all these layers may be aligned in parallel to one another.

In an embodiment, the support structure comprises at least one of the group consisting of an amorphous material, glass, silicon, silicon oxide, aluminum nitride, and oxidized aluminium. All these materials have the capability of functioning as a support on which thermally conductive and electrically insulating structures (such as diamond like carbon) may be formed by deposition. Furthermore, in particular the mentioned aluminum compounds show a proper thermal conductivity so as to further promote the heat removal capacity of the mounting device.

In an embodiment, the plurality of thermally conductive and electrically insulating structures comprises or consists of one of the group consisting of diamond-like carbon (DLC), a nitride (in particular a metal nitride), and an oxide (in particular a metal oxide such as zinc oxide, etc.).

In the context of the present application, the term "diamond-like carbon" (DLC) may be denoted as a mixture of different forms of amorphous and/or crystalline carbon materials which may have both graphitic and diamond like characteristics. DLC may contain adjustable (for instance by selecting a certain DLC production method and/or by correspondingly adjusting process parameters of a selected production method) amounts of $sp^2$ hybridized carbon atoms and/or $sp^3$ hybridized carbon atoms. By mixing these polytypes in various ways at the nanoscale level of structure, a DLC structure as thermally conductive and electrically insulating structure can be made that at the same time is amorphous, flexible, and yet of $sp^3$ bonded diamond type.

In an embodiment, a material of the thermally conductive and electrically insulating structures has a value of the thermal conductivity of at least 2 W/m K, in particular at least 50 W/m K, more particularly at least 400 W/m K. Such values of the thermal conductivity are significantly better than the thermal conductivity of conventionally used electrically insulating materials (for instance FR4: ≈0.3 W/mK) of mounting devices such as printed circuit boards, which therefore significantly improves the heat removal from the mounting device during operation of the mounting device with electronic components (such as packaged semiconductor chips, etc.) mounted thereon.

In an embodiment, at least one of two opposing main surfaces of the stack (in particular layer stack) is at least partially covered with at least one electrically insulating structure. For instance, one or more layers, sheets or foils of electrically insulating material may contact or even sandwich the stack (in particular layer stack), wherein mechanical connection between the at least one electrically insulating structure and the stack may be formed by pressing, to thereby form an interference fit assembly.

In an embodiment, a material of the electrically insulating structure comprises at least one of the group consisting of prepreg, a resin, FR4, and resin soaked glass fibres. In particular, the electrically insulating structure may be or may be based on prepreg material (such as a prepreg sheet or prepreg islands). Such prepreg material may form at least partially an electrically insulating structure of a glass fiber reinforced epoxy-based resin and may be shaped as a for instance patterned plate or sheet. Prepreg may be denoted as a glass fiber mat soaked by resin material and may be used for an interference fit assembly for the manufacture of mounting devices such as printed circuit boards. FR4 may designate a glass-reinforced epoxy material, for instance shaped as laminate sheets, tubes, rods, or plates. FR4 is a composite material composed of woven fiberglass cloth with an epoxy resin binder that is flame resistant.

The at least one electrically insulating structure may be in direct contact with an exposed surface of the thermally conductive and electrically insulating structure. This is advantageous, since many thermally conductive and electrically insulating structure such as DLC do not directly adhere properly on electrically conductive materials such as copper, but show a proper adhesion on electrically insulating materials such as FR4 or prepreg.

In an embodiment, the mounting device further comprises at least one electrically conductive structure arranged so as to form at least part of at least one of two opposing main surfaces of the mounting device, in particular arranged on at least a part of the electrically insulating structure. Such an electrically conductive structure may be a continuous or patterned sheet, layer or foil of electrically conductive material, such as a metal.

In an embodiment, the electrically conductive structure of the mounting device comprises or consists of copper. Copper is highly appropriate due to its high electrical and thermal conductivity. However, alternative materials are possible for the electrically conductive structure, such as an aluminum or nickel.

In an embodiment, each of the plurality of thermally conductive and electrically insulating structures has a thickness in a range between 10 nm and 50 µm, in particular in a range between 50 nm and 750 nm. When the thickness becomes too small, the impact on the desired increase of the thermal conductivity becomes too small. When the thickness becomes however too large, the intrinsic mechanical stability of the thermally conductive and electrically insulating structure may suffer. Therefore, in particular for DLC, the given ranges have turned out to be a proper trade-off between these two technical requirements.

In an embodiment, each of the at least one support structure has a thickness in a range between 5 nm and 50 µm, in particular in a range between 10 nm and 100 nm. Thus, sufficiently thin and nevertheless mechanical stable stacks (in particular layer stacks) may be obtained meeting both requirements of being sufficiently robust under typical application conditions as well as promoting the trend of continued miniaturization.

In particular the range of thicknesses between 50 nm and 750 nm for the thermally conductive and electrically insulating structures, in combination with the range of thicknesses between 10 nm and 100 nm for the one or more support structures provides highly advantageous results in terms of stability and thermal conductivity.

In an embodiment, a total thickness of all thermally conductive and electrically insulating structures together is larger, in particular is at least twice of, a total thickness of all support structures together. With the sandwich architecture according to exemplary embodiments, a major portion of the volume/mass of the mounting device may be contributed by the thermally conductive and electrically insulating structures rather than by the one or more support structures. With the described sandwich architecture it is possible that even very thin layers of the support structure may be capable of viewing significantly larger layers of the thermally conductive and electrically insulating material. By taking this measure, a highly thermally conductive sandwich substrate is provided which is at the same time sufficiently mechanically robust.

In an embodiment, the mounting device comprises at least one electronic component at least partially embedded within the stack (in particular layer stack). In this context, embedded means that the at least one electronic component is not mounted onto an exterior surface of the mounting device, but is structurally integrated within its interior (it may however be advantageous, in particular for electronic components being configured as a sensor, that a sub-portion of the surface of the electronic component extends up to an exposed or exterior surface of the mounting device so as to be in direct functional contact with the environments to be sensed). The at least one embedded component may comprise at least one active electric component and/or at least one passive electric component. Examples of the embedded components are a data storage memory such as a DRAM (or any other memory), a filter (which may for instance be configured as a high pass filter, a low pass filter or a bandpass filter, and which may for instance serve for frequency filtering), an integrated circuit (such as a logic IC), a signal processing component (such as a microprocessor), a power management component, an optical electrically interfacing member (for instance an optoelectronic member), a voltage converter (such as a DC/DC converter or an AC/DC converter), a cryptographic component, a capacitor, an inductance, a switch (for instance a transistor-based switch) and a combination of these and other functional electronic members.

Additionally or alternatively, the stack is at least partially embedded within an interior of the mounting device. Therefore, the stack may be used as a component providing electric insulation and thermal conductivity and may be embedded for this purpose in a certain volume section of the mounting device to specifically influence the electric and thermal behaviour of the mounting device in this volume section.

In an embodiment, the mounting device comprises at least one via extending through at least part of the mounting device for providing an electric connection between different sections of the mounting device. In particular, the one or more vias may extend through the entire stack (in particular layer stack) to thereby electrically connect opposing main surfaces of the mounting device. Such a via may be manufactured by forming a blind hole or a through hole (for instance by mechanically boring or laser drilling) extending through at least part of the mounting device (in particular through at least part of the stack and/or other portions of the mounting device) and filling this hole with electrically conductive material such as copper. By such a via, an electric connection of the embedded electronic component up to the surface of the mounting device may be achieved. Such one or more vias may also provide a thermal connection of a buried thermally conductive and electrically insulating structure up to a surface of the mounting device for further promoting efficient heat removal. In such an embodiment, efficient heat spreading can be accomplished by thermally connecting heat sources at any positions of the mounting device with the thermally conductive and electrically insulating structure(s). This significantly increases the lifetime of the mounting device.

In an embodiment, the mounting device further comprises at least one passive inlay, in particular an electrically conductive block, embedded at least partially within the mounting device, for instance within the stack (in particular layer stack). Such a passive inlay may for instance be a copper cube in an interior of the mounting device for fulfilling electric and/or thermal functions.

In an embodiment, the mounting device is configured as one of the group consisting of a circuit board (in particular a printed circuit board), an interposer and a substrate.

In the context of the present application, a "circuit board" may denote a particularly plate shaped body which has an electrically insulating core and electrically conductive structures on at least one surface of the circuit board. Such a circuit board may serve as a basis for mounting electronic members thereon and/or therein and serves both as a mechanical support platform and an electrically wiring arrangement.

In the context of the present application, a "printed circuit board" (PCB) may denote a board of an electrically insulating core (in particular comprising a compound of glass fibers and resin) covered with electrically conductive material and serving for mounting thereon one or more electronic members (such as packaged electronic chips, sockets, etc.) to be electrically coupled by the electrically conductive material. More specifically, a PCB may mechanically support and electrically connect electronic components using conductive tracks, pads and other features etched from metal structures such as copper sheets laminated onto an electrically non-conductive substrate. PCBs can be single sided (i.e. may have only one of its main surfaces covered by a, in particular patterned, metal layer), double sided (i.e. may have both of its two opposing main surfaces covered by a, in particular patterned, metal layer) or of multi-layer type (i.e. having also one or more, in particular patterned, metal layers in its interior). Conductors on different layers may be connected to one another with holes filled with electrically conductive material, which may be denoted as vias. The corresponding holes (which may be through holes or blind holes) may be formed for instance mechanically by boring, or by laser drilling. PCBs may also contain one or more electronic components, such as capacitors, resistors or active devices, embedded in the electrically insulating core.

In the context of the present application, an "interposer" may denote an electrical interface device routing between one connection to another. A purpose of an interposer may be to spread a connection to a wider pitch or to reroute a connection to a different connection. One example of an interposer is an electrical interface between an electronic chip (such as an integrated circuit die) to a ball grid array (BGA).

In the context of the present application, a "substrate" may denote a physical body, for instance comprising a ceramic material, onto which electronic components are to be mounted. Such substrates may comprise one or more amorphous materials, such as for instance glass.

In an embodiment, the stack is a patterned stack. By patterning the layer stack, in particular by a lithography and etching procedure or by laser processing, the physical properties of the mounting device may be adjusted in certain sections thereof differently.

In an embodiment, different sections of the patterned stack are separated from one another. Hence, gaps may be formed between multiple island shaped sections. Such gaps may remain empty (i.e. air gaps) or may be filled with material, in particular with thermally insulating material.

In an embodiment, the patterned stack is patterned to provide for an anisotropic thermal conductivity. Therefore, by actively adjusting or selecting one or more heat removal paths along which heat may be removed from an interior of the mounting device during operation, the heat management may be precisely controlled.

In an embodiment, the mounting device comprises at least one release structure, in particular at least one release layer, arranged on and/or in the stack, wherein the at least one release structure is made of a material being releasable from the stack. Such a removal of one or more release structures from the rest of the mounting device also allows to remove part of the thermally conductive structures together with the respective removal structure.

In an embodiment, the thermally conductive and electrically insulating structures (in particular layers) are formed on at least one of the at least one support structure by deposition. In particular, the thermally conductive and electrically insulating layer is formed on the intermediate layer by one of the group consisting of physical vapor deposition (PVD), cathodic arc deposition (ARC), chemical vapour deposition (CVD), and plasma enhanced chemical vapour deposition (PECVD). In particular, the formation may be performed by ARC, which is a physical vapor deposition technique in which an electric arc is used to vaporize material from a cathode target. Thus, a thermally conductive and electrically insulating structure formed on a support structure may be formed by deposition on the underlying support structure. It is however also possible to form the thermally conductive and electrically insulating structure on the support structure by printing, or by attaching a preformed thermally conductive and electrically insulating structure onto the support structure.

In an embodiment, a respective support structure being presently covered with a respective thermally conductive and electrically insulating structure is rotated during a respective deposition procedure. This may ensure a homogeneous thickness of the presently formed thermally conductive and electrically insulating structure. This may, in turn, efficiently suppress undesired internal tension or mechanical stress within the thermally conductive and electrically insulating structure. This may improve the mechanical robustness of the entire mounting device.

In an embodiment, multiple presently exposed main surfaces of one or more support structures may be covered or coated with a respective thermally conductive and electrically insulating structure simultaneously. In particular, thermally conductive and electrically insulating material may be deposited at the same time on particularly two exposed main surfaces by treating them in a common deposition chamber during a common deposition procedure. This may allow for an efficient manufacturing procedure of the mounting device.

In an embodiment, the method further comprises depositing (for instance from a gas phase or plasma phase) at least one further support structure for providing mechanical support onto at least one of the thermally conductive and electrically insulating structures. Hence, at least part of the support structures may be deposited on the thermally conductive and electrically insulating structure(s). Thus, alternating deposition procedures for forming thermally conductive and electrically insulating structures and for forming support structures may be carried out, for instance by only changing precursors in a deposition chamber.

In an alternative embodiment, the method further comprises attaching at least one further preformed support structure (for instance a readily manufactured foil) to at least one of the thermally conductive and electrically insulating structures, in particular by pressing or laminating. Thus, as an alternative to the above described deposition procedure for manufacturing the thermally conductive and electrically insulating structures, they can also be preformed independently from the support structure and can be attached (for instance in the form of preformed foils or sheets) onto a previously formed thermally conductive and electrically insulating structure.

In an embodiment, the method further comprises attaching at least one electrically insulating structure and/or at least one electrically conductive structure to the stack (in particular layer stack), in particular by pressing. By such a procedure, an interference fit assembly may be formed, as common in the field of manufacturing printed circuit boards.

The aspects defined above and further aspects of embodiments of the invention are apparent from the examples of embodiment to be described hereinafter and are explained with reference to these examples of embodiment.

BRIEF DESCRIPTION OF THE DRAWINGS

Embodiments of the invention will be described in more detail hereinafter with reference to examples of embodiment but to which the invention is not limited.

FIG. 6 illustrates a phase diagram indicating contributions of $sp^2$ hybridized carbon, $sp^3$ hybridized carbon and hydrogen of a carbon comprising thermally conductive and electrically insulating structure of a mounting device according to an exemplary embodiment of the invention, wherein mechanical and thermal properties of the mounting device may be adjusted by configuring a manufacturing procedure in accordance with a desired section of the phase diagram.

FIG. 7 illustrates a cross sectional view of a mounting device according to another exemplary embodiment of the invention.

FIG. 8 illustrates a cross-sectional view of a portion of the mounting device according to FIG. 7 around one of multiple vias.

DETAILED DESCRIPTION OF EXEMPLARY EMBODIMENTS

Figure 1:
FIG. 1 illustrates a cross sectional view of a layer sequence as a preform for a mounting device according to an exemplary embodiment of the invention.

The illustrations in the drawings are schematical. In different drawings, similar or identical elements are provided with the same reference signs.

Before exemplary embodiments will be described in further detail referring to the figures, some general considerations of the present inventors will be presented based on which exemplary embodiments have been developed.

According to an exemplary embodiment of the invention, stacked layers of thermally highly conductive materials (in particular a DLC stack) are implemented as a constituent for a mounting device in order to promote heat spreading and/or heat removal.

Conventionally, prints are formed of an electrically insulating carrier material on which at least one copper layer is provided. The layer thicknesses of such carrier materials are typically in the order of magnitude between several nanometers and several ten micrometers. Such carrier materials are conventionally constituted of glass fiber mats soaked with epoxy resin (so-called FR4). FR4 materials have a thermal conductivity of about 0.3 W/m K (along a z-axis, i.e. the thickness or through plane) and about 0.8 W/m K (xy-plane, in plane). It is known that cloth, fibers and/or filling particles can be equipped with specific coatings to improve thermal conductivity.

According to an exemplary embodiment of the invention, planar carrier layers (for instance embodied as glass sheets, glass foils, and/or sputtered silicon dioxide) may be arranged as support structures between thermally conductive and electrically insulating layers. This allows to overcome the conventional shortcoming that, when manufacturing mounting devices for mounting electronic components, different electronic components may generate different amounts of heat (which may for instance be high when using power electronic components). Moreover, different electronic components may have different heat sensitivity (for instance electrolyte capacitors have a lower lifetime at higher temperature). Both heat spreading as well as heat removal can be improved by the stacking architecture according to an exemplary embodiment of the invention. This prevents, even considering continued miniaturization, that large amount of heat is conducted towards sensitive electronic components by heat conduction.

According to an exemplary embodiment of the invention, a print material is provided which may have a higher heat conduction value in x-direction, y-direction and z-direction, as compared to conventional systems. For this purpose, support structures or carriers (for instance of oxidized aluminum or glass, for example having a thickness of 35 μm, wherein significantly smaller thicknesses are possible) are coated with a material (such as a nitride, an oxide, or DLC) which can have a sufficiently high value of the thermal conductivity, for instance between 5 W/m K and 500 W/m K. The layer thickness can be up to 50 μm or more, but should usually not be smaller than 5 nm, for some materials not smaller than 150 nm.

Such a composite can be accomplished by coating a carrier material with a specialized form of carbon (DLC)—or nitride or oxide or a mixture of these and/or other materials—alternatingly with a further carrier layer (for instance a glass foil, sputtered silicon or silicon oxide). Coating may be performed for instance using PVD or PECVD. By repeating this procedure, an arrangement of many parallel aligned thin layers may be obtained. By taking this measure, the cross sectional area of the thermally conductive and electrically insulating layer(s) is increased so that consequently heat spreading, heat distribution and heat removal can be strongly increased as compared to a single layer architecture. Apart from the increase of the thermal cross section, the layer sequence is advantageous also for the further reason, that hydrogen depleted carbon layers tend to form internal tension when the layer thicknesses become too large, which may result in undesired delamination. For the example of the preferred material DLC, it may be advantageous to use a hydrogen depleted form, since this form has a specifically high value of the thermal conductivity. Moreover, such materials can be processed with conventional processing methods in circuit board industry (such as high-density interconnect (HDI), multilayer, embedding) or in integrated circuit (IC) substrate industry.

Hence, an exemplary embodiment of the invention provides a mounting device with at least one DLC layer on a carrier (for instance glass or glass foil), or a multilayer composition for thermal spreading, heat removal, and heat distribution. Such an embodiment is appropriate in particular for power applications (for instance with electronic components such as IGBTs, insulated gate bipolar transistors, embedded components, etc.), for mobile applications and for integrated circuit substrates.

FIG. 1 illustrates a cross sectional view of a layer sequence or layer stack 100 as a preform for a mounting device 400 according to an exemplary embodiment of the invention.

The layer stack 100 shown in FIG. 1 can be manufactured by depositing a thermally conductive and electrically insulating structure 104, shaped as a layer, on a support structure 102, which is shaped as a layer as well. The support structure 102 can for instance be made of glass, but may also be a sputtered layer of silicon or a silicon oxide ($SiO_2$) layer. The thermally conductive and electrically insulating structure 104 may be made of diamond like carbon (DLC) and may be deposited on the support structure 102, for instance by PVD or PECVD. For example, a thickness, d, of the support structure 102 may be 50 nm. Such a thickness may provide sufficient mechanical support and sufficient adhesion promotion capability for thermally conductive and electrically insulating material. Furthermore, a thickness, I, of the thermally conductive and electrically insulating structure 104 may be 300 nm. Such a thickness is large enough so as to significantly contribute to the heat spreading and heat removal properties of the mounting device 400 to be manufactured, and at the same time is thin enough so as to prevent undesired internal mechanical stress within the thermally conductive and electrically insulating structure 104.

Figure 2:
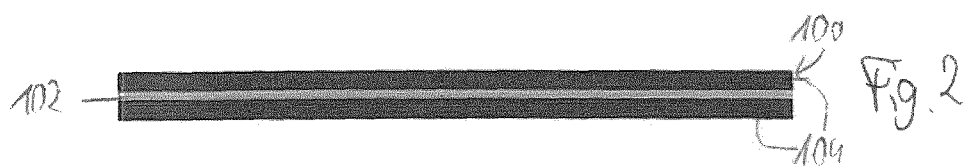
FIG. 2 illustrates a cross sectional view of another layer sequence as a preform for a mounting device according to an exemplary embodiment of the invention.

FIG. 2 illustrates a cross sectional view of a layer sequence or layer stack 100 as a preform for a mounting device 400 according to an exemplary embodiment of the invention.

In comparison to the layer stack 100 shown in FIG. 1, the layer stack 100 shown in FIG. 2 comprises an additional thermally conductive and electrically insulating structure 104 arranged on the exposed main surface of the support structure 102 shown in FIG. 1. The formation of the layer stack 100 shown in FIG. 2 based on the layer stack 100 shown in FIG. 1 can be accomplished by depositing DLC material constituting the additional thermally conductive and electrically insulating structure 104 onto the exposed surface of the support structure 102. This deposition procedure can for instance be carried out again by PVD or PECVD.

It is however also possible to deposit both thermally conductive and electrically insulating structures 104 on the two opposing main surfaces of the sheet like support structure 102 in one common or simultaneous manufacturing procedure. For instance, this can be accomplished by placing the support structure 102 in a processing chamber of a deposition apparatus and then start the deposition (for instance by PVD or PECVD). Optionally, it is possible to rotate the support structure 102 during the deposition procedure, to thereby promote a homogeneous thickness of the layers constituting the thermally conductive and electrically insulating structures 104 on both opposing main surfaces of the planar support structure 102.

Figure 3:
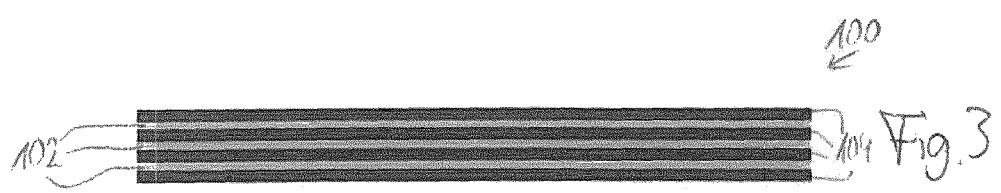
FIG. 3 illustrates a cross sectional view of yet another layer sequence as a preform for a mounting device according to an exemplary embodiment of the invention.

FIG. 3 illustrates a cross sectional view of a layer sequence or layer stack 100 as a preform for a mounting device 400 according to an exemplary embodiment of the invention.

The layer stack 100 shown in FIG. 3 can be obtained based on the layer stack shown in FIG. 2 by alternatively adding further layer-shaped support structures 102 and further layer-shaped thermally conductive and electrically insulating structures 104. The layer stack 100 shown in FIG. 3 hence comprises a plurality of support structures 102 (in the shown embodiment three support structures 102) as well as a plurality of thermally conductive and electrically insulating structures 104 (in the shown embodiment four thermally conductive and electrically insulating structures 104). The opposing two main surfaces of each of the support structures 102 is hereby covered by respectively two of the thermally conductive and electrically insulating structures 104.

Starting from the layer sequence 100 shown in FIG. 2, the layer sequence 100 shown in FIG. 3 can be manufactured by depositing a further support structure 102 for providing mechanical support onto an exposed surface of one of the thermally conductive and electrically insulating structures 104. The other exposed surface of the other thermally conductive and electrically insulating structure 104 of FIG. 2 can be also covered by depositing yet another support structure 102. After that, the exposed main surfaces of the two additionally formed support structures 102 may then be covered by further thermally conductive and electrically insulating structures 104, which, in turn, can be manufactured again by deposition, as described above.

As an alternative to the deposition of the additional support structures 102, they can also be formed by attaching preformed support structures 102 (such as glass foils) onto exposed main surfaces of the thermally conductive and electrically insulating structures 104, in particular by pressing or laminating.

The described procedures can be repeated a desired number of times until a layer sequence 100 of sufficient thickness, sufficient mechanical stability and sufficient heat removal and heat distribution as well as heat spreading capability is obtained.

Figure 4:
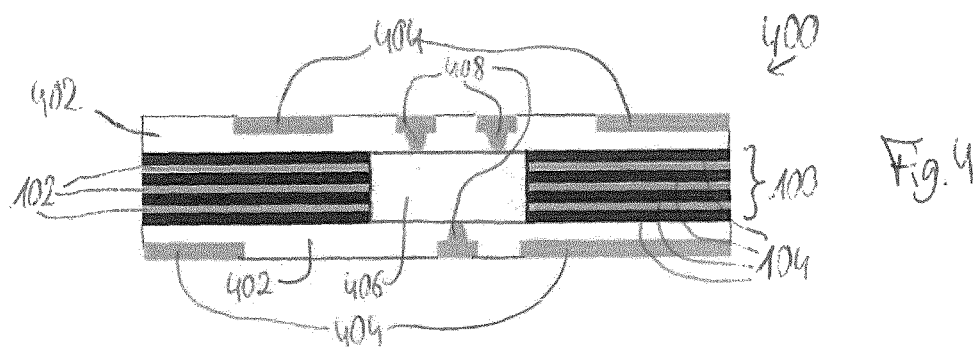
FIG. 4 illustrates a cross sectional view of a mounting device according to an exemplary embodiment of the invention implementing the layer sequence of FIG. 3.

FIG. 4 illustrates a cross sectional view of a mounting device 400 according to an exemplary embodiment of the invention, which is embodied as a printed circuit board.

The mounting device 400 is configured for mounting electronic components (not shown) on exposed main surfaces thereof. The mounting device 400 comprises the layer stack 100 of FIG. 3 integrated therein.

For manufacturing the mounting device 400 using the layer stack 100 of FIG. 3, a central through hole is formed in the layer stack 100, for instance by laser processing or by a mechanical procedure or by a combined lithography and etching procedure. The mounting device 400 furthermore comprises an electronic component 406 (such as a packaged chip, a capacitor, etc.) embedded within the layer stack 100, more precisely accommodated within the previously formed through hole.

After that, the two opposing main surfaces of the layer stack 100 (constituted by exposed surfaces of thermally conductive and electrically insulating structures 104 as well as exposed surface portions of the embedded electronic component 406) are covered with a respective one of two electrically insulating structures 402 embodied as sheets or films. Preferably, the material of the electrically insulating structures 402 is prepreg. Connection of the layer stack 100 with the embedded electronic component 406 and the electrically insulating structures 402 may be accomplished by pressing, to thereby form an interference fit assembly.

The mounting device 400 further comprises electrically conductive structures 404 arranged so as to form part of the two opposing main surfaces of the mounting device 400, and arranged on the electrically insulating structure 402. The electrically conductive structures 404 may be patterned electrically conductive sheets such as copper foils. Also the electrically conductive structures 404 are mechanically connected to the layer stack 100 and the rest of the mounting device 400 by pressing. Hence, the layer stack 100 is embedded within an interior of the mounting device 400.

Furthermore, the mounting device 400 comprises vias 408 extending through part of the mounting device 400 for providing an electric connection between different sections of the mounting device 400. In the shown embodiment, the vias 408 provide for an electric connection between the embedded electronic component 406 and an electronic periphery (not shown).

Figure 5:
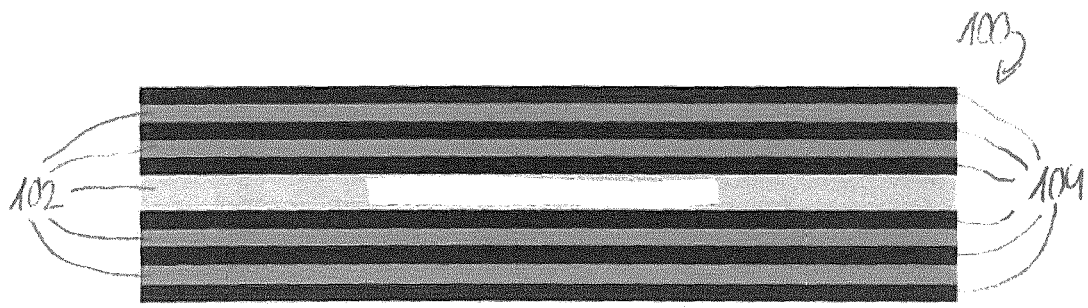
FIG. 5 illustrates a cross sectional view of a layer sequence for a mounting device according to another exemplary embodiment of the invention.

FIG. 5 illustrates a cross sectional view of a symmetric layer sequence 100 for a mounting device 400 according to another exemplary embodiment of the invention.

A central support structure 102 can be configured as a sheet or layer having a larger thickness than all remaining sheets or layers of the layer sequence 100. Both opposing exposed main surfaces of the central support structure 102 may then be covered by a respective thermally conductive and electrically insulating structure 104, in the shown embodiment also configured as planar layers (for instance of DLC or another amorphous carbon compound, for instance having a thickness of 2 μm to 3 μm, or less, for example 50 nm to 750 nm). Both opposing exposed main surfaces of the formed thermally conductive and electrically insulating structures 104 may then be covered by a respective further support structure 102 (for instance of aluminum nitride), in the shown embodiment also configured as planar layers. This can be followed by the further formation of further thermally conductive and electrically insulating structures 104, further support structures 104, etc. The described procedure can be repeated a number of times, in accordance with a desired layer sequence 100 to be manufactured.

The layer sequence 100 shown in FIG. 5 is a sandwich composition which can be formed starting from the central support structure 102 as carrier, for instance an oxidized aluminum foil. A goal of this architecture is to obtain a layer sequence of thermally conductive property which has sufficient mechanical robustness so that it can be further processed with common processing methods of printed circuit board technology (such as HDI, multilayer, embedding) or integrated circuit substrate technology. In particular, the layer sequence 100 shown in FIG. 5 is also appropriate for embedding electronic components 406 therein, as shown in FIG. 4.

FIG. 6 illustrates a phase diagram 600 indicating contributions of $sp^2$ hybridized carbon, $sp^3$ hybridized carbon and hydrogen of a carbon comprising thermally conductive and electrically insulating structure 104 of a mounting device 100 according to an exemplary embodiment of the invention, wherein mechanical and thermal properties of the mounting device 100 may be adjusted by configuring a manufacturing procedure in accordance with a desired section of the phase diagram 600.

According to the phase diagram 600, the thermally conductive and electrically insulating structure 104 of diamond like carbon DLC is a hydrogen H comprising amorphous carbon coating with a mixture of $sp^2$ and $sp^3$ hybridized carbon. Preferably, the portion of $sp^2$ hybridized carbon is in a range between 40 and 60 weight percent of the thermally conductive and electrically insulating structure 104, the portion of $sp^3$ hybridized carbon is in a range between 25 and 40 weight percent of the thermally conductive and electrically insulating structure 104, and the percentage of hydrogen is above 10 weight percent preferably not above 40 weight percent. When the thermally conductive and electrically insulating structure 104 is formed by sputtering/ physical vapor deposition (PVD), the percentage of $sp^2$ hybridized carbon is high. When however plasma enhanced chemical vapor deposition (PECVD) is used for forming the thermally conductive and electrically insulating structure 106, a higher hydrogen percentage is obtained. With a high percentage of $sp^2$ hybridized and $sp^3$ hybridized carbon, a high thermal conductivity of the thermally conductive and electrically insulating structure 104 may be obtained. With a high hydrogen percentage, a mechanically stable thermally conductive and electrically insulating structure 104 is obtained. By a selection of the manufacturing procedure for instance also adjustment of the precise process parameters and/or, if desired, a combination of the above-mentioned manufacturing procedures, the mechanical and thermal properties of the thermally conductive and electrically insulating structure 104 may be precisely set. A particularly appropriate composition in terms of the mechanical and thermal properties is shown in FIG. 6 with an area denoted with reference numeral 602.

FIG. 7 is a cross sectional view of a mounting device 400 according to another exemplary embodiment of the invention.

The mounting device 400 is embodied as a printed circuit board and comprises electrically insulating structure 402, for instance made of FR4 material. Between two opposing sheets of the electrically insulating structure 402 a layer stack 100 with an alternating arrangement of support structures 102 and thermally conductive and electrically insulating structures 104 is sandwiched or embedded. Patterned metal foils on opposing exposed main surfaces of the sheets of the electrically insulating structure 402 form an electrically conductive structure 404.

FIG. 7 furthermore shows through holes through the electrically insulating structure 402 and the layer sequence 100 filled with vias 408 which electrically connect portions of the electrically conductive structure 404 on two opposing main surfaces of the mounting device 400.

Optionally, the electrically conductive vias 408 may be circumferentially covered with a tubular layer stack 100 according to an exemplary embodiment of the invention, as will be described in further detail referring to FIG. 8.

FIG. 8 illustrates a cross-sectional view of a portion of the mounting device 400 according to FIG. 7 around one of the vias 408 and along a line A-B shown in FIG. 7.

The vias 408 may comprise a post-shaped central portion of electrically conductive material (for instance made of copper) covered with tubular layer stack 100. The tubular layer stack 100 comprises a hollow cylindrical or tubular support structure 102 (for instance of glass, silicon or silicon oxide) which, in turn, is covered with a hollow cylindrical or tubular thermally conductive and electrically insulating structure 104 (for instance made of DLC). One or more further support structures 102 and one or more further thermally conductive and electrically insulating structures 104 may follow.

Figure 9:
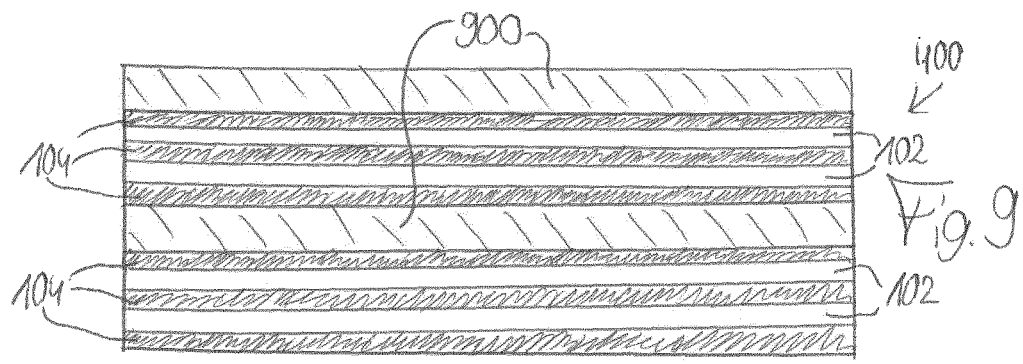
FIG. 9 illustrates a cross sectional view of yet another layer sequence as a mounting device or a preform for a mounting device according to an exemplary embodiment of the invention.

FIG. 9 illustrates a cross sectional view of yet another layer sequence as a mounting device 400 or a preform (i.e. a layer stack 100) for a mounting device 400 according to an exemplary embodiment of the invention.

The mounting device 400 of FIG. 9 comprises two release structures 900, both embodied as release layer. One of the release structures 900 is arranged on top of an upper stack of thermally conductive and electrically insulating structures 104 and support structures 102. The other one of the release structures 900 is arranged between the upper stack and a lower stack of thermally conductive and electrically insulating structures 104 and support structures 102. Each of the release structures 900 is made of a material being releasable from the respective stack(s). By releasing the upper release structure 900 according to FIG. 9, the upper stack is exposed to an environment. By releasing the lower release structure 900 according to FIG. 9, the two stacks may be separated from one another, thereby removing also part of the thermally conductive and electrically insulating part of the mounting device 400.

Figure 10:
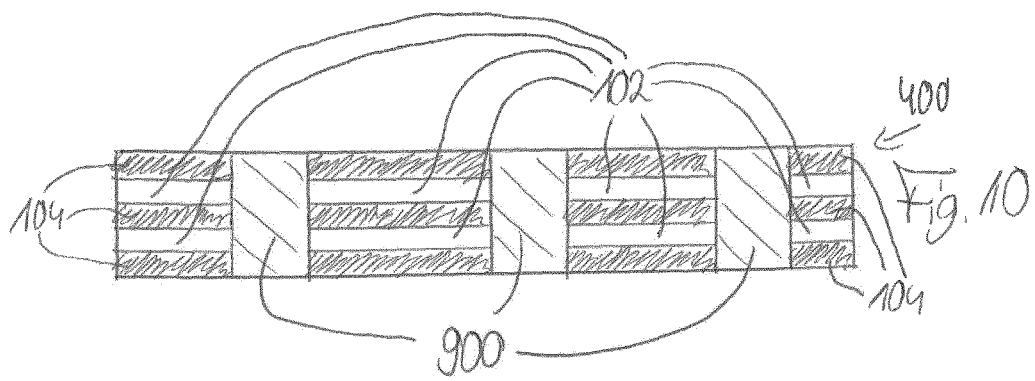
FIG. 10 illustrates a cross sectional view of yet another layer sequence as a mounting device or a preform for a mounting device according to an exemplary embodiment of the invention.

FIG. 10 illustrates a cross sectional view of yet another layer sequence as a mounting device 400 or a preform (i.e. a layer stack 100) for a mounting device 400 according to an exemplary embodiment of the invention.

According to FIG. 10, the stack of thermally conductive and electrically insulating structures 104 and support structures 102 is a patterned stack. The patterning is performed in such a manner that different sections of the patterned stack are separated from one another to thereby provide for an anisotropic thermal conductivity within the mounting device 400. Between the various sections, release structures 900 are interleaved. However, gaps between the various sections may also remain empty or filled with another kind of material.

Figure 11:
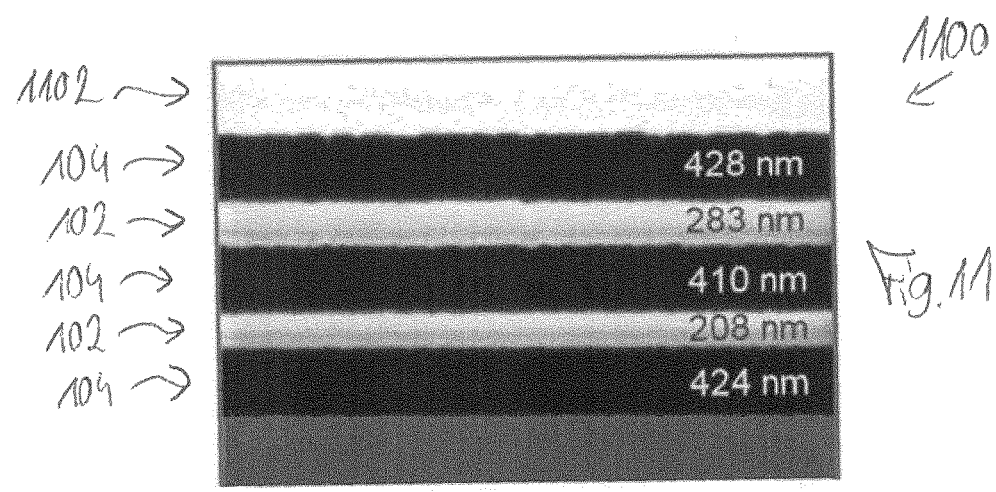
FIG. 11 illustrates an SEM (scanning electron microscope) image showing a cross sectional view of a layer sequence as or for a mounting device according to an exemplary embodiment of the invention.

FIG. 11 illustrates an SEM (scanning electron microscope) image 1100 showing a cross sectional view of a layer sequence as or for a mounting device 400 according to an exemplary embodiment of the invention.

The layer sequence shown in image 1100 shows alternating layers of DLC as thermally conductive and electrically insulating structures 104 and layers of silicon dioxide ($SiO_2$) as support structures 102. As can be taken from FIG. 11, DLC layers having a thickness between substantially 410 nm and substantially 430 nm in combination with $SiO_2$ layers having a thickness between substantially 210 nm and substantially 280 nm where obtained which showed sufficient stability while simultaneously having a high thermal conductivity. A protection layer 1102, for instance of platinum, is shown as well.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A mounting device for mounting electronic components, wherein the mounting device comprises:
   a stack, configured as an alternating sequence of a plurality of support structures for providing mechanical support and a plurality of thermally conductive and electrically insulating structures,
   wherein the stack comprises an alternating sequence of the plurality of support structures and the plurality of thermally conductive and electrically insulating structures,
   wherein the plurality of thermally conductive and electrically insulating structures comprises diamond-like carbon,
   wherein the percentage of hydrogen of the diamond-like carbon is above 10 weight percent.

2. The mounting device according to claim 1, wherein at least one of the group consisting of the support structure and the thermally conductive and electrically insulating structures is formed as a layer.

3. The mounting device according to claim 1, wherein the support structure comprises at least one of the group consisting of an amorphous material, glass, silicon, silicon oxide, aluminum nitride, and oxidized aluminium.

4. The mounting device according to claim 1, wherein the mounting device comprises at least one of the following features:
   a material of the thermally conductive and electrically insulating structures has a value of the thermal conductivity of at least 2 W/m K;
   at least two opposing main surfaces of the stack is at least partially covered with at least one electrically insulating structure.

5. The mounting device according to claim 1, further comprising:
   at least one electrically conductive structure arranged so as to form at least part of at least one of two opposing main surfaces of the mounting device.

6. The mounting device according to claim 1, wherein the mounting device comprises at least one of the following features:
   each of the plurality of thermally conductive and electrically insulating structures has a thickness in a range between 10 nm and 50 µm;
   each of the at least one support structure has a thickness in a range between 5 nm and 50 µm.

7. The mounting device according to claim 1, wherein a total thickness of all thermally conductive and electrically insulating structures together is larger than a total thickness of all support structures together.

8. The mounting device according to claim 1, comprising:
   at least one electronic component at least partially embedded within the stack.

9. The mounting device according to claim 1, wherein the stack is at least partially embedded within an interior of the mounting device.

10. The mounting device according to claim 1, comprising at least one of the following features:
    at least one via extending through at least part of the mounting device for providing an electric connection between different sections of the mounting device to thereby electrically connect opposing main surfaces of the mounting device;
    at least one passive inlay embedded at least partially within the stack.

11. The mounting device according to claim 1, wherein the stack is a patterned stack.

12. The mounting device according to claim 11, wherein different sections of the patterned stack are separated from one another.

13. The mounting device according to claim 11, wherein the patterned stack is patterned to provide for an anisotropic thermal conductivity.

14. The mounting device according to claim 1, comprising:
    at least one release structure arranged on and/or in the stack, wherein the at least one release structure is made of a material being releasable from the stack.

15. A method of manufacturing a mounting device for mounting electronic components, the method comprising:
    forming a stack as an alternating sequence of a plurality of support structures for providing mechanical support and a plurality of thermally conductive and electrically insulating structures,
    wherein the plurality of thermally conductive and electrically insulating structures comprises diamond-like carbon where hydrogen in the diamond like carbon is above a weight percent of 10, wherein the stack comprises the alternating sequence of the plurality of support structures and the plurality of thermally conductive and electrically insulating structures.

16. The method according to claim 15, wherein the plurality of thermally conductive and electrically insulating structures is deposited on opposing main surfaces of at least one of the at least one support structure.

17. The method according to claim 15, further comprising:

depositing at least one further support structure for providing mechanical support onto at least one of the thermally conductive and electrically insulating structures.

18. The method according to claim 15, further comprising:

attaching at least one further preformed support structure to at least one of the thermally conductive and electrically insulating structures.

19. The method according to claim 15, further comprising:

attaching at least one electrically insulating structure and/or at least one electrically conductive structure to the stack.

20. A mounting device for mounting electronic components, the mounting device comprising:

a stack, configured as an alternating sequence of a plurality of support structures for providing mechanical support and a plurality of thermally conductive and electrically insulating structures, wherein the stack comprises an alternating sequence of the plurality of support structures and the plurality of thermally conductive and electrically insulating structures, wherein the plurality of thermally conductive and electrically insulating structures comprises diamond-like carbon, wherein the percentage of hydrogen of the diamond-like carbon is above 10 weight percent, and wherein the portion of $sp^2$ hybridized carbon of the diamond-like carbon is in a range between 40 and 60 weight percent.

* * * * *